(12) United States Patent
Lee et al.

(10) Patent No.: US 8,658,347 B2
(45) Date of Patent: Feb. 25, 2014

(54) METHOD OF MANUFACTURING MICRO LENS ARRAY

(75) Inventors: Han Sup Lee, Incheon (KR); Boung Guk Park, Incheon (KR); Chul-jin Jo, Incheon (KR); Ki Woon Choi, Incheon (KR)

(73) Assignee: INHA-Industry Partnership Institute, Incheon (KR)

( * ) Notice: Subject to any disclaimer, the term of this patent is extended or adjusted under 35 U.S.C. 154(b) by 218 days.

(21) Appl. No.: 13/225,832

(22) Filed: Sep. 6, 2011

(65) Prior Publication Data
US 2012/0070785 A1 Mar. 22, 2012

(30) Foreign Application Priority Data

Sep. 17, 2010 (KR) .................. 10-2010-0091849
Sep. 17, 2010 (KR) .................. 10-2010-0091850
Oct. 12, 2010 (KR) .................. 10-2010-0099275

(51) Int. Cl.
*G03F 7/00* (2006.01)

(52) U.S. Cl.
USPC .................. 430/321; 430/322; 430/325

(58) Field of Classification Search
USPC ............... 430/321, 322, 325; 349/61, 62, 95; 359/619; 264/1.7
See application file for complete search history.

(56) References Cited

U.S. PATENT DOCUMENTS 6,633,351 B2 * 10/2003 Hira et al. .................. 349/95
2001/0012078 A1 * 8/2001 Hira et al. .................. 349/95

* cited by examiner

*Primary Examiner* — Stewart Fraser
(74) *Attorney, Agent, or Firm* — Sherr & Jiang, PLLC

(57) ABSTRACT

A method of manufacturing a micro lens array, wherein the quality of an image is prevented from being deteriorated as a beam on an off-axis surface reaches a focal plane of a micro lens by forming a shading film for preventing the beam from penetrating through a space between micro lenses of the micro lens array, a micro lens having a high numerical aperture or any shape, such as an aspheric shape, is quickly manufactured at a low cost, and the micro lenses and a mask pattern are easily aligned by forming a mask pattern on a focus region formed by the micro lenses of the micro lens array.

11 Claims, 7 Drawing Sheets

METHOD OF MANUFACTURING MICRO LENS ARRAY

CROSS-REFERENCE TO RELATED PATENT APPLICATION

This application claims the benefit of Korean Patent Application Nos. 10-2010-0091849, filed on Sep. 17, 2010, 10-2010-0091850, filed on Sep. 17, 2010, and 10-2010-0099275, filed on Oct. 12, 2010, in the Korean Intellectual Property Office, the disclosure of which is incorporated herein in its entirety by reference.

BACKGROUND OF THE INVENTION

1. Field of the Invention

The present invention relates to a method of manufacturing a micro lens array, and more particularly, to a method of manufacturing a micro lens array, which prevents a beam on an off-axis from reaching a focal plane of a micro lens, enables easy alignment of the micro lens and a pattern where a focus is formed, and can quickly manufacture a lens having any one of various shapes at a low cost.

2. Description of the Related Art

A micro lens is defined to have a diameter below or equal to 1 mm, but a lens having a diameter equal to or above 5 mm is sometimes considered also as a micro lens.

Generally, a lens, specifically a micro lens, is used in a display device, an optical communication component, or a light emitting diode device so as to control convergence, diffusion, and reflection of a light (hereinafter, a lens includes a micro lens), and it is important to control a shape of such a lens so that the lens has a desired optical property.

A micro lens array may be classified into a sea island type, where micro lenses are arranged at regular intervals, and a line type, where micro lenses are arranged in a straight line, according to an arrangement of micro lenses.

Examples of a method of manufacturing the micro lens array include a method of molding a glass material by using a mold, a method of molding a resin by inserting the resin between a stamper and a substrate, and a photolithography method. However, such methods require a model or a mask to form a micro lens, and it is difficult to quickly form micro lenses having a predetermined shape in a predetermined arrangement.

Also, in the micro lens array in which plurality of micro lenses are arranged, a space between lenses is formed of the same transparent material as the lenses. Thus, if a beam on an off-axis surface penetrated through the space is irradiated on a focus of the micro lenses, the beam may adversely affect an image obtained by the micro lenses.

Also, since the lenses of the micro lens array are very small, it is very difficult to align the micro lens and a mask pattern where a focus is formed by the micro lens.

SUMMARY OF THE INVENTION

The present invention provides a method of manufacturing a micro lens array for preventing a quality of an image on a focal plane of a micro lens from deteriorating due to a beam on an off-axis surface, by forming a shading film preventing the beam from penetrating through a space between lenses in the micro lens array.

The present invention also provides a method of manufacturing a micro lens array, which can quickly manufacture a lens having a high numerical aperture or any shape, such as an aspheric shape, at a low cost.

The present invention also provides a method of manufacturing a micro lens array, where a micro lens and a mask pattern are easily aligned by forming the mask pattern at a focus region formed by a lens of the micro lens array.

According to an aspect of the present invention, there is provided a method of manufacturing a micro lens, the method including: preparing a master plate having a plurality of molding grooves on one side, inside a vacuum chamber; forming a shading film for blocking a beam, by depositing a metal or coating ink or black matrix between the plurality of molding grooves; preparing a substrate constituting a raw material of a micro lens, inside the vacuum chamber; forming a vacuum inside the vacuum chamber; adhering the master plate and the substrate; heating the substrate; releasing the vacuum inside the vacuum chamber; and forming a micro lens by separating the master plate and the substrate.

The method may further include cooling the substrate and the master plate to a temperature that does not deform the substrate and the master plate.

A melting point of the metal or an evaporating temperature of the ink or black matrix may be higher than a temperature applied to the substrate during the heating of the substrate.

The substrate may include polycarbonate (PC), polymethyl methacrylate (PMMA), and polystyrene (PS).

Duration of the forming of the micro lens may vary according to a curvature of the micro lens.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown.

First, a lens manufacturing apparatus used to perform a method of manufacturing a micro lens, according to an embodiment of the present invention will be described.

Figure 1:
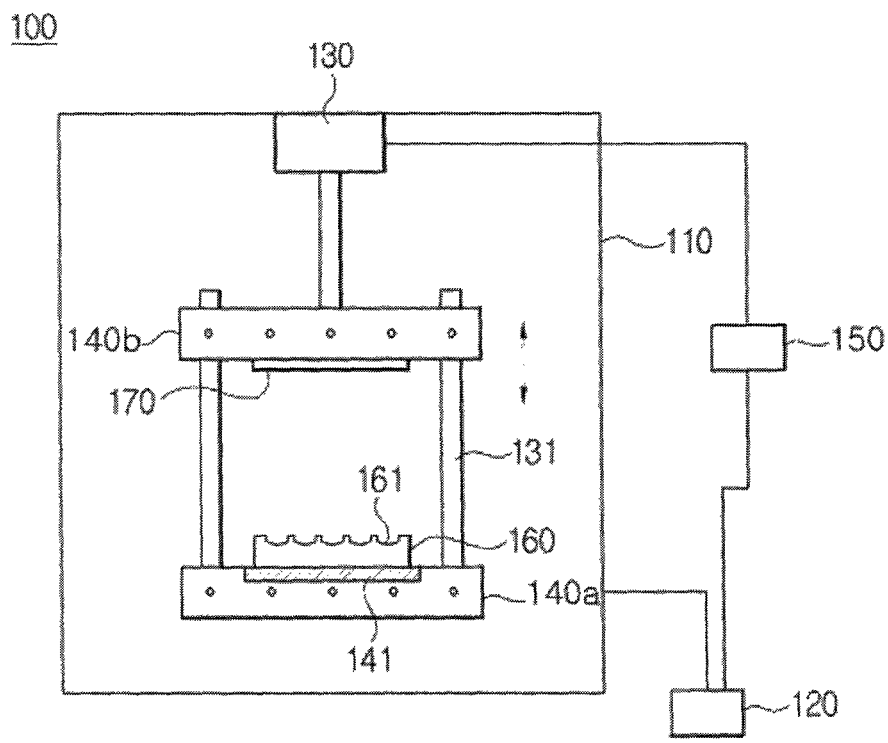
FIG. 1 is a diagram of a lens manufacturing apparatus for performing a method of manufacturing a micro lens, according to an embodiment of the present invention.
Figure 2:
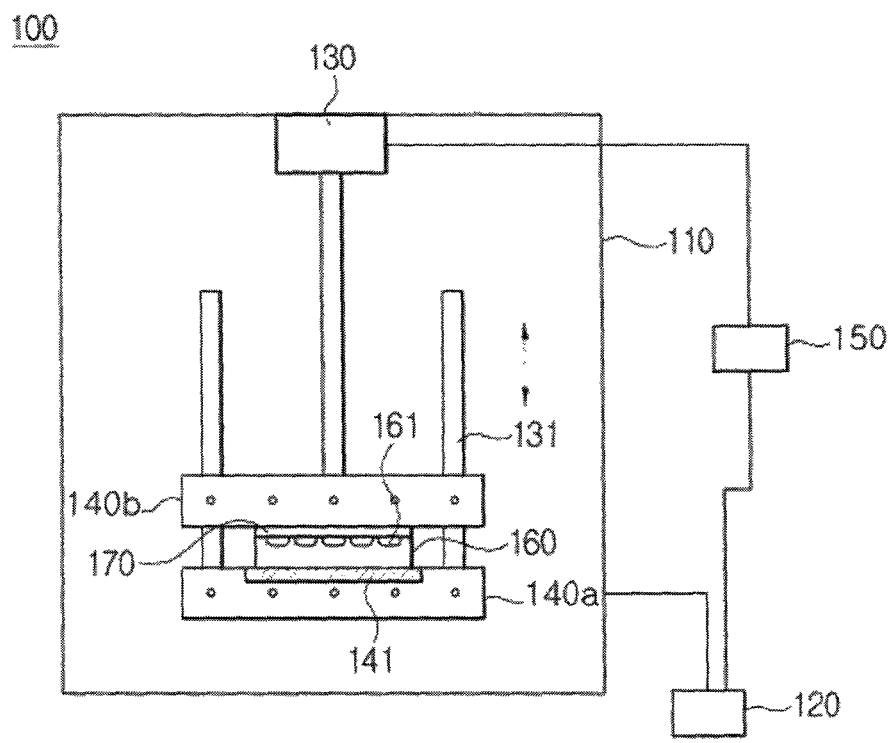
FIG. 2 is a diagram for describing an operation of the lens manufacturing apparatus of FIG. 1.

FIG. 1 is a diagram of a lens manufacturing apparatus for performing a method of manufacturing a micro lens, according to an embodiment of the present invention, and FIG. 2 is a diagram for describing an operation of the lens manufacturing apparatus 100 of FIG. 1.

Referring to FIGS. 1 and 2, the lens manufacturing apparatus 100 includes a vacuum chamber 110, a vacuum unit 120, an elevating cylinder 130, a lower frame 140a, an upper frame 140b, and a controller 150.

The vacuum chamber 110 provides a lens manufacturing space by forming a vacuum therein. The vacuum chamber 110 is selectively sealed according to a progress of operations and may maintain or release a vacuum.

Also, a vacuum unit 120 for selectively forming a vacuum inside the vacuum chamber 110 may be disposed at one side of the vacuum chamber 110.

The vacuum unit 120 may include a vacuum pump (not shown) for forming a vacuum and fluid line (not shown) for transferring a fluid, such as air, and details thereof will be omitted herein.

The elevating cylinder 130 ascends and descends the upper frame 140b to be described later. The elevating cylinder 130 may be a pneumatic cylinder or a hydraulic cylinder, but any other moving element may be used as long as the upper frame 140b is easily ascended and descended.

At least one guide road 131 may be connected to the upper frame 140b so as to guide the ascending and descending of the upper frame 140b by the elevating cylinder 130.

The lower frame 140a is provided at a bottom surface of the vacuum chamber 110, and a master plate 160 for manufacturing a micro lens is disposed on the lower frame 140a. Also, a heating unit 141 for applying heat to the master plate 160 is disposed at a side of the lower frame 140a. The heating unit 141 includes a hot-wire heater, and first heats the master plate 160. The heat applied to the master plate 160 is transferred to a substrate 170 above the master plate 160, thereby heating the substrate 170.

The upper frame 140b is provided above the lower frame 140a at a predetermined height. The substrate 170 constituting a raw material of a micro lens is installed to a bottom surface of the upper frame 140b. The upper frame 140b adheres the substrate 170 to the master plate 160 after the substrate 170 is placed on the master plate 160. Also, after a micro lens is formed on the substrate 170, the upper frame 140b separates the substrate 170 from the master plate 160.

The upper frame 140b places the substrate 170 on the master plate 160 as shown in FIG. 2.

The controller 150 is provided outside the vacuum chamber 110. The controller 150 controls operations of the vacuum unit 120 and the elevating cylinder 130 according to a shape of micro lens input by a user.

Meanwhile, the lens manufacturing apparatus 100 may further include a cooler supplier (not shown) for supplying cooling air to cool down the substrate 170 to an optimal temperature so as to prevent the substrate 170 from being deformed while being separated from the master plate 160 after the micro lens is formed.

Figure 3:
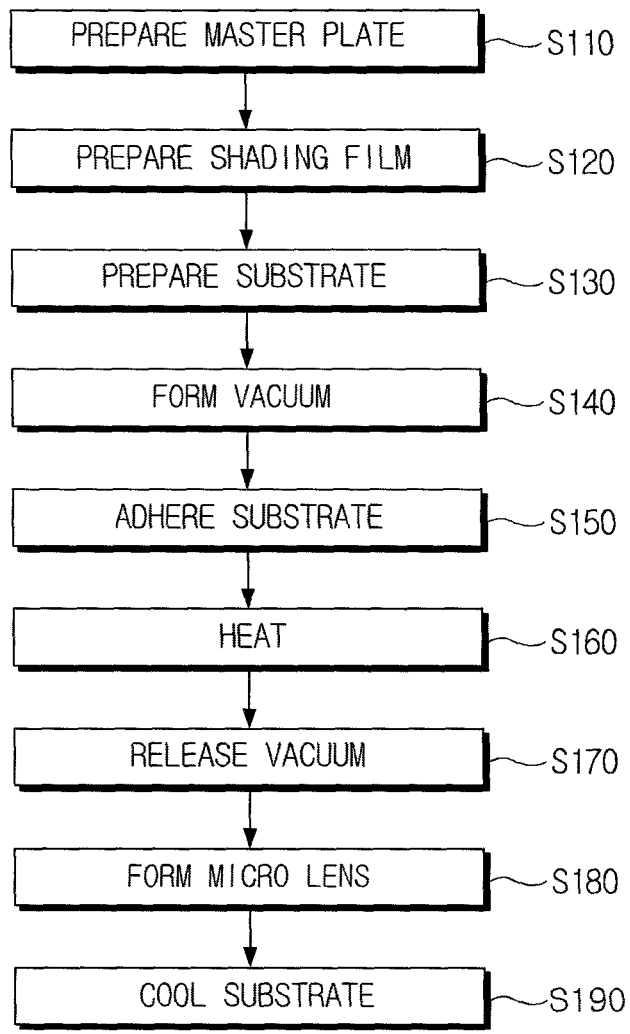
FIG. 3 is a flowchart illustrating a method of manufacturing a micro lens, according to an embodiment of the present invention.

FIG. 3 is a flowchart illustrating a method of manufacturing a micro lens, according to an embodiment of the present invention.

FIGS. 4A through 4E are diagrams for describing processes of manufacturing a micro lens according to the method of FIG. 3, according to an embodiment of the present invention. Also, FIGS. 5A through 5E are diagrams for describing processes of manufacturing a micro lens according to the method of FIG. 3, according to another embodiment of the present invention.

Referring to FIG. 3, the method includes preparing a master plate in operation S110, preparing a shading film in operation S120, preparing a substrate in operation S130, forming a vacuum in operation S140, adhering in operation S150, heating in operation S160, releasing the vacuum in operation S170, forming a micro lens in operation S180, and cooling the substrate in operation S190.

The method will now be described in detail with reference to FIGS. 4A through 4E and 5A through 5E.

In operation S110, the master plate 160 constituting a base of manufacturing a required micro lens is disposed inside the vacuum chamber 110. The master plate 160 is placed on the lower frame 140a disposed inside the vacuum chamber 110.

Figure 4:
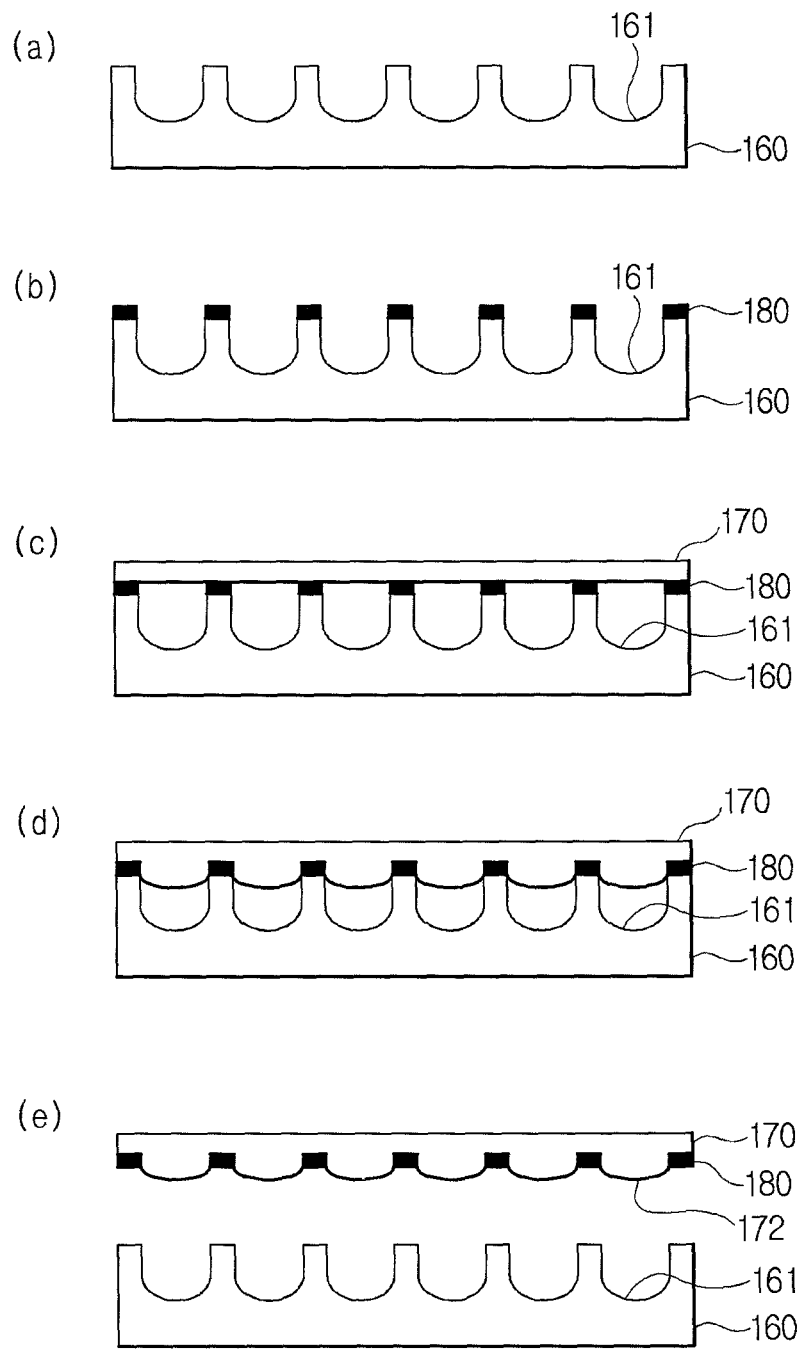
FIGS. 4A through 4E are diagrams for describing processes of manufacturing a micro lens according to the method of FIG. 3, according to an embodiment of the present invention.
Figure 5:
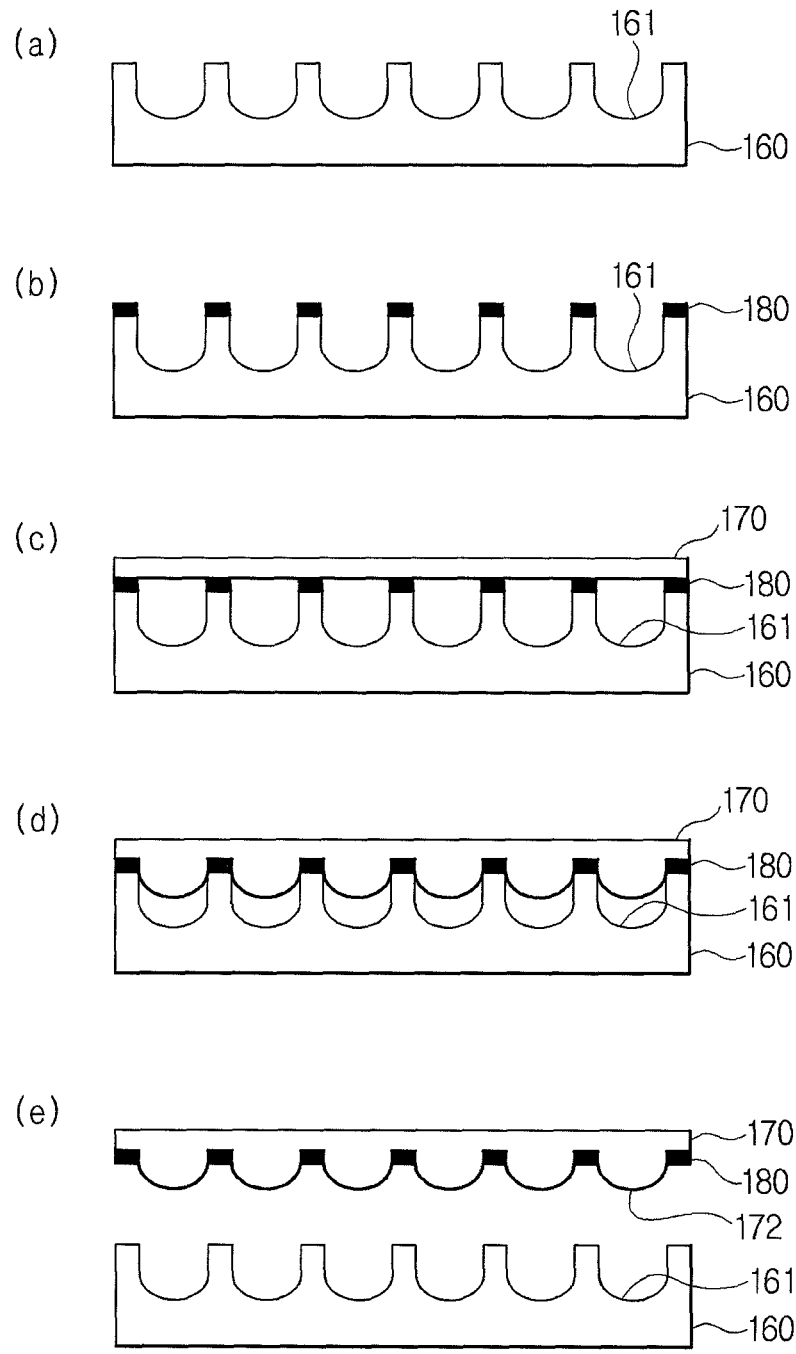
FIGS. 5A through 5E are diagrams for describing processes of manufacturing a micro lens according to the method of FIG. 3, according to another embodiment of the present invention.

Referring to FIGS. 4A and 5A, the master plate 160 has a plate shape having a predetermined area, and a plurality of molding grooves 161 are formed on the master plate 160 at regular intervals. The molding groove 161 is a hemispherical groove, and is has a depth larger than a thickness of a micro lens to be actually manufactured. Here, the molding groove 161 has a hemispherical groove, but a groove having another shape, such as a cylindrical shape, may be formed according to a use of a micro lens. Also, a number of the molding grooves 161 may be determined according to requirement of a user, such as a number of micro lenses manufactured at once.

In operation S120, a predetermined metal is deposited or predetermined ink or black matrix is coated between the molding grooves 161 formed on the master plate 160 to form a shading film 180. Referring to FIGS. 4B and 5B, when a micro lens array is completed, the metal, ink, or black matrix on the master plate 160 is adhered on the micro lens array, thereby operating as a shading film for blocking light between the micro lenses.

Any metal or ink may be used as long as it can block light and is not damaged by heat applied during operations. Also, the black matrix is a black coating layer formed by coating black photo resist. Since the black matrix is black, it can block light irradiated between the micro lenses.

A melting point of the metal and an evaporating temperature of the ink or black matrix may be higher than a temperature applied to the substrate 170 during operation S160 that will be described later, so that the metal, ink, or black matrix is not melted or evaporated during operation S160.

In operation S130, the substrate 170 constituting a raw material of the micro lens is disposed inside the vacuum chamber 110. The substrate 170 may be a polymer film. Here, a material of the master plate 160 is selected according to a type of the micro lens, and may generally be polycarbonate (PC), polymethyl methacrylate (PMMA), or polystyrene (PS).

The substrate 170 is disposed on a bottom surface of the upper frame 140b.

In operation S140, the vacuum chamber 110 is vacuumed by using the vacuum unit 120. Here, a vacuum pressure of the vacuum chamber 110 is adjusted according to a shape of the micro lens to be formed. In other words, when a user selects a standard type lens, the controller 150 controls the vacuum unit 120 to adjust a vacuum level of the vacuum chamber 110 to a predetermined standard level.

In operation S150, the substrate 170 is adhered to the master plate 160 so that an internal space of the molding groove 161 is isolated from the outside. In other words, the upper frame 140b descends according to an operation of the elevating cylinder 130, and the substrate 170 contacts an upper surface of the master plate 160. Then, the master plate 160 and the substrate 170 are adhered to each other as the upper frame 140b moves downward and presses the top surface of the substrate 170 at a predetermined pressure while the substrate 170 is contacting the top surface of the master plate 160.

Referring to FIGS. 4C and 5C, the internal space of the molding groove 161 is isolated from the outside as the master plate 160 and the substrate 170 are adhered to each other.

In operation S160, a predetermined heat is applied to the substrate 170 while the master plate 160 and the substrate 170 are adhered to each other. In other words, the heating unit 141 operates the hot-wire heater to heat the master plate 160. The heat applied to the master plate 160 is transferred to the substrate 170 on the master plate 160, thereby heating the substrate 170.

The substrate 170 heated by using the master plate 160 as a medium may be heated up to 100 to 300° C. If the substrate 170 is heated to a temperature below or equal to 100° C., the substrate 170 may not be deformed during operation S180 that will be described later, and thus a micro lens may not be smoothly formed. Alternatively, if the substrate 170 is heated to a temperature equal to or above 300° C., the substrate 170 may be excessively deformed, and thus the micro lens may not have an accurate curvature.

In operation S170, the vacuum inside the vacuum chamber 110 is released while the master plate 160 and the substrate 170 are adhered to each other. IN other words, the vacuum chamber 110 is opened to release the vacuum inside the vacuum chamber 110.

In operation S180, a plurality of convex lenses in a micro unit are formed on one side of the substrate 170 according to a pressure difference between the vacuum released vacuum chamber 110 and the molding grooves 161.

This will be described in detail.

When the vacuum inside the vacuum chamber 110 is released by opening the vacuum chamber 110, the inside of the vacuum chamber 110 maintains an atmospheric pressure while the inside of the molding grooves 161 maintains a vacuum, thereby generating the pressure difference. Then, the substrate 170 is convexly molded into the molding grooves 161 to form the micro lenses according to the pressure difference. Accordingly, the micro lenses are formed on one surface of the substrate 170. Here, a shape of the micro lens differs according to a period of time (lens forming time) from the vacuum of the vacuum chamber 110 is released to the substrate 170 and the master plate 160 are separated, and thus duration of operation S180 is adjusted according to the shape of the micro lenses.

Referring to FIG. 4D, the micro lenses having a convex lens shape in a predetermined curvature are formed on a front surface of the substrate 170 separated from the master plate 160, and a rear surface of the substrate 170 is flat.

Also, referring to FIG. 5D, the front surface of the substrate 170 separated from the master plate 160 is convex, and the rear surface of the substrate 170 is flat. Also, the micro lenses on the front surface of the substrate 170 have a larger curvature than the micro lenses of FIG. 4D.

As such, the micro lenses are formed on the front surface of the substrate 170 as a predetermined time passes from a point of time when the micro lenses start to form by releasing the vacuum of the vacuum chamber 110 to a point of time when the substrate 170 and the master plate 160 are separated from each other. Accordingly, comparing FIGS. 4D and 5D, it can be determined that operation S180 is performed for a longer time in FIG. 5D than in FIG. 4D to form the micro lens having a larger curvature.

Operation S190 may be performed after operation S180, or may be performed at the same time as operation S180 so as to quickly form the micro lens.

After forming the micro lenses having a desired curvature on the substrate 170, the substrate 170 is separated from the master plate 160. While separating the substrate 170 from the master plate 160, the substrate 170 may be cooled in operation S190 by supplying a cooling gas at a predetermined temperature into the vacuum chamber 110 so as to prevent the substrate 170 from being deformed. Here, the supplied cooling gas may be atmosphere at room temperature or air at a predetermined temperature.

When the substrate 170 is cooled down to a temperature that does not deform the substrate 170, the substrate 170 is separated from the master plate 160 by ascending the upper frame 140b according to an operation of the elevating cylinder 130.

Referring to FIGS. 4E and 5E, the shading films 180 are formed on the substrate 170 separated from the master plate 160 after the master plate 160 and the substrate 170 are cooled down to a predetermined temperature. Here, the substrate 170 is a plate type micro lens array having a plurality of micro lenses 172 in a convex lens shape.

According to the current embodiment of the present invention, the quality of an image may be prevented from being deteriorated as a beam on an off-axis surface reaches a focal plane of micro lenses, by forming a shading film preventing the beam from penetrating through a space between the micro lenses of a micro lens array.

Also, a micro lens having a high numerical aperture or any shape, such as an aspheric shape, may be quickly manufactured at a low cost.

Figure 6:
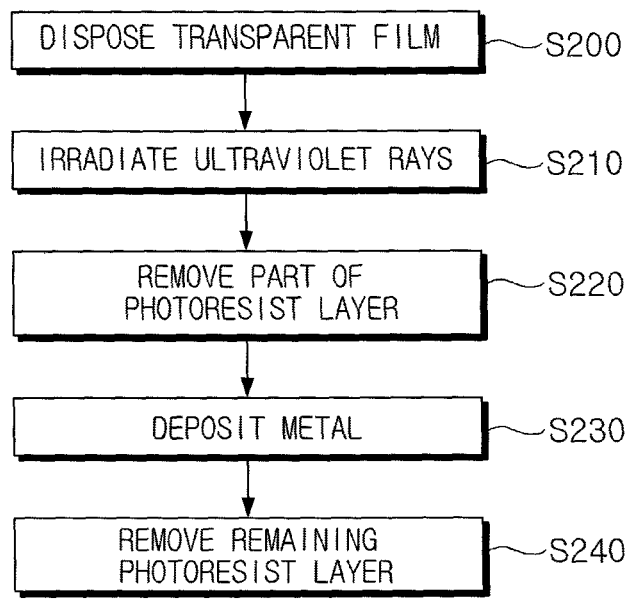
FIG. 6 is a flowchart illustrating a method of manufacturing a micro lens array, according to an embodiment of the present invention.

FIG. 6 is a flowchart illustrating a method of manufacturing a micro lens array, according to an embodiment of the present invention.

Referring to FIG. 6, the method includes disposing a transparent film in operation S200, irradiating ultraviolet rays in operation s210, removing a part of a photoresist layer in operation S220, depositing a metal in operation S230, and corroding the photoresist layer in operation S240.

Here, in order to perform the method of FIG. 6, the method of FIG. 3 may be pre-performed.

In other words, a micro lens may be performed by performing operations S110 through S190 of the method of FIG. 3.

Here, since the method of FIG. 3 has been described above, details thereof will not be repeated.

FIGS. 7A through 7E are diagrams for describing processes of manufacturing a micro lens array 200 according to the method of FIG. 6, according to an embodiment of the present invention.

The method will now be described with reference to FIGS. 6 and 7A through 7E.

Figure 7:
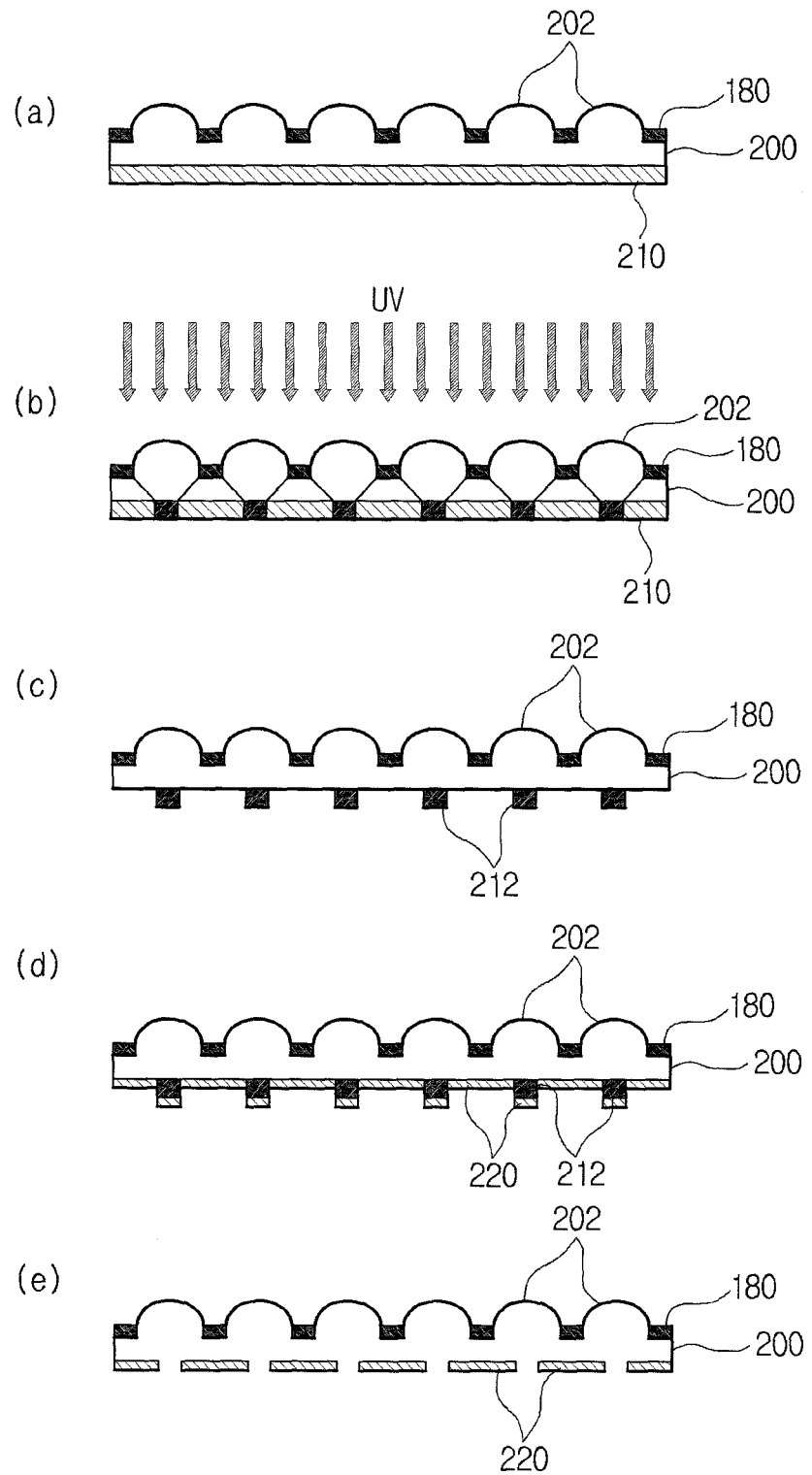
FIGS. 7A through 7E are diagrams for describing processes of manufacturing a micro lens array according to the method of FIG. 6, according to an embodiment of the present invention.

Referring to FIG. 7A, a transparent film 210 on which a photoresist layer is formed is disposed on one surface of the micro lens array 200, in operation S200. Here, a region where the transparent film 210 is disposed may be a plane region of the micro lens array 200, i.e., a focal plane of the micro lenses having a convex lens shape formed on the micro lens array 200.

After the transparent film 210 is disposed, ultraviolet rays UV is irradiated on the micro lens array 200 in operation S210. Here, as shown in FIG. 7B, the ultraviolet rays UV is irradiated toward the micro lens array 200 from an opposite side of the transparent film 210. Here, the irradiated ultraviolet rays UV may be parallel to an optical axis of each unit micro lens 202. Here, the shading film 180 formed on the micro lens array 200 prevents the ultraviolet rays UV from incident on the transparent film 210 from an off-axis direction of the unit micro lens 202.

The irradiated ultraviolet rays UV form a focus on the transparent film 210 by using each unit micro lens 202, and are mainly irradiated on such a focus region. Accordingly, a part (hereinafter, referred to as a photoresist hardened region 212) of the photoresist layer on a focal plane of the unit micro lens 202 from among the photoresist layer on the transparent film 210 is hardened by the ultraviolet rays UV.

Then, as shown in FIG. 7C, the remaining photoresist layer is removed from the transparent film 210 in operation S220 except for the photoresist hardened region 212, by performing a process, such as a chemical treatment.

Next, as shown in FIG. 7D, a metal layer 220 is formed on the transparent film 210 in operation S230. According to FIG. 7D, the metal layer 220 is formed on the photoresist hardened region 212, and only the metal layer 220 is formed on the transparent film 210 in a region where the photoresist layer is removed.

Then, as shown in FIG. 7E, when the remaining photoresist layer is removed in operation S240, the photoresist hardened region 212 is removed and thus only the metal layer 220 on the transparent film 210 is left. Here, a region where the photoresist hardened region 212 hardened by the ultraviolet rays UV was located includes a pattern in a hole shape capable of penetrating through a beam.

According to the micro lens array manufactured as above, a micro lens and a mask pattern where a focus of the micro lens is formed may be easily aligned by hardening a photoresist layer in a focus region by forming the focus with the micro lens in the micro lens array, and then removing only the hardened photoresist layer to use a region where the hardened photoresist layer is removed as a pattern where a focus is formed.

Figure 8:
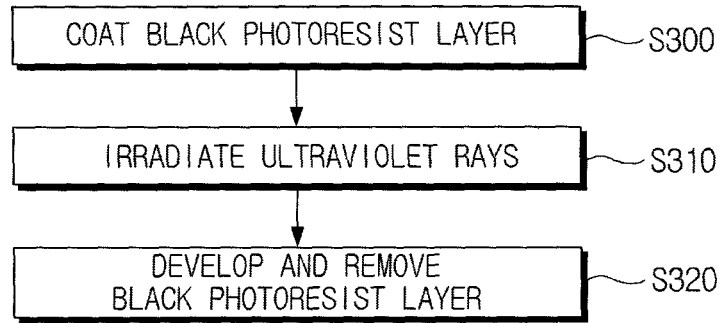
FIG. 8 is a flowchart illustrating a method of manufacturing a micro lens array, according to another embodiment of the present invention.

FIG. 8 is a flowchart illustrating a method of manufacturing a micro lens array, according to another embodiment of the present invention.

Referring to FIG. 8, the method includes coating black photoresist layer in operation S300, irradiating ultraviolet rays in operation S310, and developing and removing the black photoresist layer in operation S320.

Here, in order to perform the method of FIG. 8, the method of FIG. 3 may be pre-performed.

In other words, a micro lens may be performed by performing operations S110 through S190 of the method of FIG. 3.

Here, since the method of FIG. 3 has been described above, details thereof will not be repeated.

Figure 9:
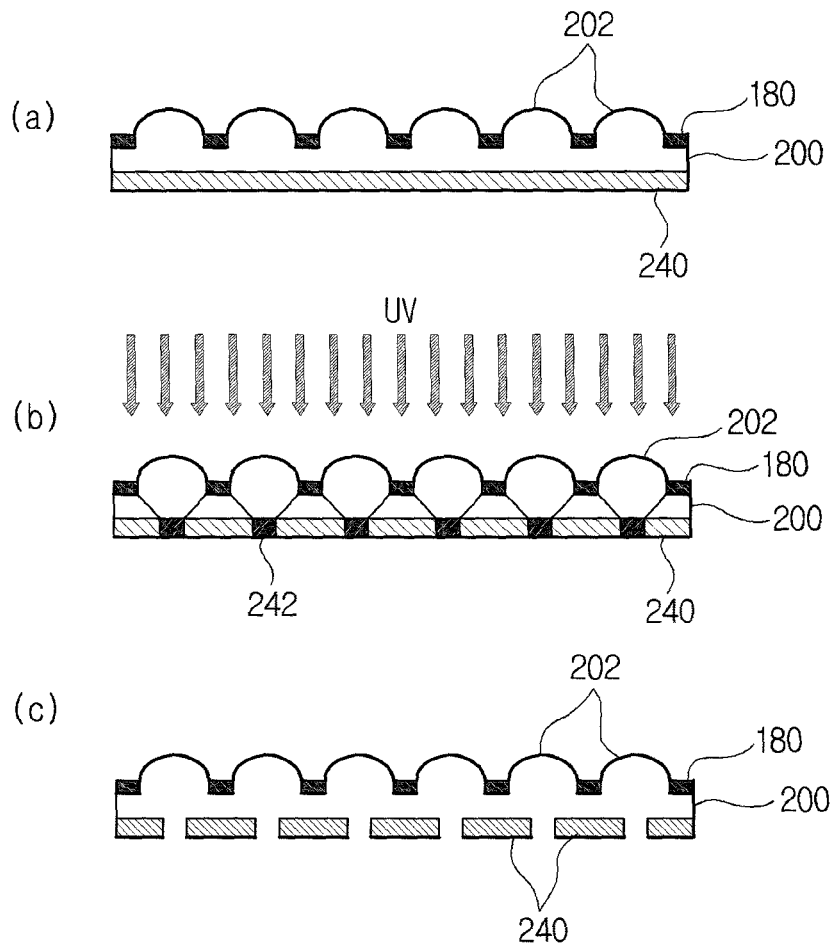
FIGS. 9A through 9C are diagrams for describing processes of manufacturing a micro lens array according to the method of FIG. 8, according to an embodiment of the present invention.

FIGS. 9A through 9C are diagrams for describing processes of manufacturing a micro lens array according to the method of FIG. 8, according to an embodiment of the present invention.

Here, like reference numerals denote like elements, and details thereof will not be repeated herein.

Referring to FIG. 9A, a black photoresist layer 240 is coated on one surface of the micro lens array 200. Here, the surface where the black photoresist layer 240 is coated may be flat surface of the micro lens array 200, i.e., may be a focal plane where ultraviolet rays UV irradiated in operation S310 that will be described later are focused by micro lenses having a convex lens shape formed on the micro lens array 200.

After the black photoresist layer 240 is coated, the ultraviolet rays UV is irradiated on the micro lens array 200 in operation S310. Here, as shown in FIG. 9B, the ultraviolet rays UV may be irradiated toward the micro lens array 200 from an opposite side of the black photoresist layer 240. Also, the irradiated ultraviolet rays UV may be parallel to an optical axis of the unit micro lens 202. Here, the shading film 180 formed on the micro lens array 200 prevents the ultraviolet rays UV from incident on the black photoresist layer 240 from an off-axis direction of the unit micro lens 202.

The irradiated ultraviolet rays UV are mainly irradiated on a focus region formed on the black photoresist layer 240 by each unit micro lens 202. Accordingly, black photoresist on a focal plane of the unit micro lens 202 from among black photoresist on the black photoresist layer 240 is hardened. Since a focus of the unit micro lens 202 is formed in a predetermined size, a black photoresist hardened region 242 having a predetermined size is formed on the black photoresist layer 240.

Then, as shown in FIG. 9C, the black photoresist hardened region 212 is removed from the black photoresist layer 240 in operation S320 by performing a process, such as developing.

A region where the black photoresist hardened region 212 was located includes a pattern having a hole shape capable of penetrating through a beam. Here, a user may obtain a pattern having a desired size by changing a focal length of the unit micro lens 202 on the micro lens array 200.

According to the micro lens array manufactured as above, a micro lens and a mask pattern where a focus of the micro lens is formed may be easily aligned by hardening a black photoresist layer in a focus region by forming the focus with the micro lens in the micro lens array, and then removing only the hardened black photoresist layer to use a region where the black hardened photoresist layer is removed as a pattern where a focus is formed.

According to the present invention, a quality of an image can be prevented from being deteriorated as a beam on an off-axis surface reaches a focal plane of a micro lens, by forming a shading film preventing the beam from penetrating through a space between micro lenses in a micro lens array.

Also, a lens having a high numerical aperture or any shape, such as an aspheric shape, can be quickly manufactured at a low cost.

Further, a micro lens and a mask pattern can be easily aligned by forming the mask pattern at a focus region formed by a lens of the micro lens array.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a micro lens array comprising a plurality of micro lenses and a mask pattern where a focus is formed by the plurality of micro lenses, the method comprising:
    disposing a transparent film on which photoresist is coated at one side of the plurality of micro lenses;
    hardening the photoresist on a focus of the plurality of micro lenses by irradiating ultraviolet rays on the plurality of micro lenses;
    removing the photoresist except for a region where it is hardened;
    depositing a metal on the transparent film; and
    removing the photoresist on the transparent film,
    wherein the plurality of micro lenses is manufactured by:
    preparing a master plate having a plurality of molding grooves on one side, inside a vacuum chamber;
    forming a shading film for blocking a beam, by depositing a metal or coating ink or black matrix between the plurality of molding grooves;

preparing a substrate constituting a raw material of a micro lens, inside the vacuum chamber;
forming a vacuum inside the vacuum chamber;
adhering the master plate and the substrate;
heating the substrate;
releasing the vacuum inside the vacuum chamber; and
forming the plurality of micro lenses by separating the master plate and the substrate.

2. The method of claim 1, wherein the plurality of micro lenses is manufactured by further cooling the substrate and the master plate to a temperature that does not deform the substrate and the master plate.

3. The method of claim 1, wherein a melting point of the metal or an evaporating temperature of the ink or black matrix is higher than a temperature applied to the substrate during the heating of the substrate.

4. The method of claim 1, wherein duration of the forming of the plurality of micro lenses varies according to a curvature of the plurality of micro lenses.

5. The method of claim 1, wherein the ultraviolet rays are parallel to an optical axis of the plurality of micro lenses.

6. A method of manufacturing a micro lens array comprising a plurality of micro lenses and a mask pattern where a focus is formed by the plurality of micro lenses, the method comprising:
    coating a black photoresist on one surface of the plurality of micro lenses;
    hardening the black photoresist on a focus of the plurality of micro lenses by irradiating ultraviolet rays on the plurality of micro lenses; and
    developing and removing a region of the black photoresist, which is hardened,
    wherein the plurality of micro lenses is manufactured by:
    preparing a master plate having a plurality of molding grooves on one side, inside a vacuum chamber;
    forming a shading film for blocking a beam, by depositing a metal or coating ink or black matrix between the plurality of molding grooves;
    preparing a substrate constituting a raw material of a micro lens, inside the vacuum chamber;
    forming a vacuum inside the vacuum chamber;
    adhering the master plate and the substrate;
    heating the substrate;
    releasing the vacuum inside the vacuum chamber; and
    forming the plurality of micro lenses by separating the master plate and the substrate.

7. The method of claim 6, wherein the plurality of micro lenses is manufactured by further cooling the substrate and the master plate to a temperature that does not deform the substrate and the master plate.

8. The method of claim 6, wherein a melting point of the metal or an evaporating temperature of the ink or black matrix is higher than a temperature applied to the substrate during the heating of the substrate.

9. The method of claim 6, wherein duration of the forming of the plurality of micro lens varies according to a curvature of the plurality of micro lens.

10. The method of claim 6, wherein the surface of the plurality of micro lenses coated with the black photoresist is a focal plane of the ultraviolet rays irradiated on the micro lens array.

11. The method of claim 6, wherein the ultraviolet rays are parallel to an optical axis of the plurality of micro lenses.

\* \* \* \* \*